US011650412B2

(12) United States Patent
Uyeno et al.

(10) Patent No.: US 11,650,412 B2
(45) Date of Patent: May 16, 2023

(54) OPTICAL NON-UNIFORMITY CORRECTION (NUC) FOR ACTIVE MODE IMAGING SENSORS USING MICRO-ELECTRO-MECHANICAL SYSTEM (MEMS) MICRO-MIRROR ARRAYS (MMAS)

(71) Applicant: Raytheon Company, Waltham, MA (US)

(72) Inventors: Gerald P. Uyeno, Tucson, AZ (US); Sean D. Keller, Tucson, AZ (US); Benn H. Gleason, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 374 days.

(21) Appl. No.: 17/014,350

(22) Filed: Sep. 8, 2020

(65) Prior Publication Data

US 2021/0092260 A1 Mar. 25, 2021

Related U.S. Application Data

(60) Provisional application No. 62/903,244, filed on Sep. 20, 2019.

(51) Int. Cl.
*G02B 26/08* (2006.01)
*H04J 14/02* (2006.01)
(Continued)

(52) U.S. Cl.
CPC ........ *G02B 26/0841* (2013.01); *B81B 3/0062* (2013.01); *G02B 6/3512* (2013.01); (Continued)

(58) Field of Classification Search
CPC .............. G02B 26/0841; G02B 6/3512; G02B 26/0833; G02B 26/101; G02B 6/3518; (Continued)

(56) References Cited

U.S. PATENT DOCUMENTS

| 5,404,375 A | 4/1995 | Kroeger et al. |
| 5,854,702 A | 12/1998 | Ishikawa et al. |

(Continued)

OTHER PUBLICATIONS

"Mirrorcle Technologies MEMS Mirrors—Technical Overview", Mirrorcle Technologies, Inc., (2018), 7 pgs.

(Continued)

*Primary Examiner* — Michael E Teitelbaum
(74) *Attorney, Agent, or Firm* — Schwegman Lundberg & Woessner, P.A.

(57) ABSTRACT

An active mode image sensor for optical non-uniformity correction (NUC) of an active mode sensor uses a Micro-Electro-Mechanical System (MEMS) Micro-Mirror Array (MMA) having tilt, tip and piston mirror actuation to form and scan a laser spot that simultaneously performs the NUC and illuminates the scene so that the laser illumination is inversely proportional to the response of the imager at the scan position. The MEMS MMA also supports forming and scanning multiple laser spots to simultaneously interrogate the scene at the same or different wavelengths. The piston function can also be used to provide wavefront correction. The MEMS MMA may be configured to generate a plurality of fixed laser spots to perform an instantaneous NUC.

20 Claims, 15 Drawing Sheets

(51) Int. Cl.

| | |
|---|---|
| *H04Q 11/00* | (2006.01) |
| *G02B 6/35* | (2006.01) |
| *H04B 10/29* | (2013.01) |
| *H04B 10/40* | (2013.01) |
| *H04B 10/50* | (2013.01) |
| *H04B 10/66* | (2013.01) |
| *B81B 3/00* | (2006.01) |
| *G02B 26/10* | (2006.01) |
| *H04N 5/217* | (2011.01) |
| *H04B 10/118* | (2013.01) |
| *H04B 10/112* | (2013.01) |
| *H04N 25/63* | (2023.01) |

(52) U.S. Cl.
CPC ....... *G02B 26/0833* (2013.01); *G02B 26/101* (2013.01); *H04B 10/118* (2013.01); *H04B 10/1123* (2013.01); *H04B 10/29* (2013.01); *H04B 10/40* (2013.01); *H04B 10/50* (2013.01); *H04B 10/66* (2013.01); *H04J 14/02* (2013.01); *H04J 14/0267* (2013.01); *H04N 25/63* (2023.01); *H04Q 11/0005* (2013.01); *B81B 2203/053* (2013.01)

(58) Field of Classification Search
CPC ............ B81B 3/0062; B81B 2203/053; H04B 10/1123; H04B 10/118; H04B 10/29; H04B 10/40; H04B 10/50; H04B 10/66; H04J 14/02; H04J 14/0267; H04N 5/2176; H04Q 11/0005; H04Q 2011/003; H04Q 2011/0039
See application file for complete search history.

(56) References Cited

U.S. PATENT DOCUMENTS

| | | | |
|---|---|---|---|
| 5,923,036 A * | 7/1999 | Tague, Jr. ............. | G01J 3/2823 |
| | | | 250/353 |
| 6,181,450 B1 | 1/2001 | Dishman et al. | |
| 6,271,953 B1 | 8/2001 | Dishman et al. | |
| 6,327,063 B1 | 12/2001 | Rockwell | |
| 6,567,574 B1 | 5/2003 | Ma et al. | |
| 7,593,641 B2 | 9/2009 | Tegge, Jr. | |
| 7,660,235 B2 | 2/2010 | Alicherry et al. | |
| 8,301,027 B2 | 10/2012 | Shaw et al. | |
| 8,983,293 B2 | 3/2015 | Frankel et al. | |
| 9,473,768 B2 | 10/2016 | Uyeno et al. | |
| 9,477,135 B1 | 10/2016 | Uyeno et al. | |
| 10,243,654 B1 | 3/2019 | Uyeno et al. | |
| 10,444,492 B2 | 10/2019 | Hopkins et al. | |
| 10,718,491 B1 | 7/2020 | Raring et al. | |
| 10,998,965 B2 | 5/2021 | Tong et al. | |
| 11,042,025 B2 | 6/2021 | Uyeno et al. | |
| 2002/0141689 A1 | 10/2002 | Qian et al. | |
| 2002/0196506 A1 | 12/2002 | Graves et al. | |
| 2003/0081321 A1 | 5/2003 | Moon et al. | |
| 2003/0185488 A1 | 10/2003 | Blumenthal | |
| 2004/0072540 A1 | 4/2004 | Wilson et al. | |
| 2004/0081466 A1 | 4/2004 | Walther et al. | |
| 2004/0141752 A1 | 7/2004 | Shelton et al. | |
| 2004/0258415 A1 | 12/2004 | Boone et al. | |
| 2005/0031255 A1 | 2/2005 | Schroeder et al. | |
| 2005/0100339 A1 | 5/2005 | Tegge | |
| 2005/0122566 A1 | 6/2005 | Cicchiello | |
| 2005/0288031 A1 | 12/2005 | Davis et al. | |
| 2006/0038103 A1 | 2/2006 | Helmbrecht | |
| 2007/0031157 A1 | 2/2007 | Yamada et al. | |
| 2007/0036480 A1 | 2/2007 | Wu | |
| 2008/0050064 A1 | 2/2008 | Sakai et al. | |
| 2010/0166430 A1 | 7/2010 | Alten | |
| 2012/0002973 A1 | 1/2012 | Bruzzi et al. | |
| 2012/0114337 A1 | 5/2012 | Aoki | |
| 2012/0155885 A1 | 6/2012 | Hannah et al. | |
| 2013/0271818 A1 | 10/2013 | Bastien et al. | |
| 2015/0099476 A1 | 4/2015 | Beals | |
| 2015/0172218 A1 | 6/2015 | Beshai | |
| 2015/0311981 A1 | 10/2015 | Inagaki et al. | |
| 2015/0378242 A1 | 12/2015 | Auxier et al. | |
| 2016/0043800 A1 | 2/2016 | Kingsbury et al. | |
| 2016/0065956 A1 * | 3/2016 | Uyeno ................. | H04N 5/2256 |
| | | | 348/187 |
| 2016/0234703 A1 | 8/2016 | Aldana et al. | |
| 2016/0294472 A1 | 10/2016 | Palmer et al. | |
| 2017/0025149 A1 * | 1/2017 | Ahner ............... | G01N 21/8806 |
| 2017/0293137 A1 | 10/2017 | Zhao et al. | |
| 2018/0231715 A1 | 8/2018 | Bishop et al. | |
| 2019/0154921 A1 | 5/2019 | Xing et al. | |
| 2019/0310965 A1 * | 10/2019 | Panas .................... | G06F 13/126 |
| 2020/0244359 A1 | 7/2020 | Csonka et al. | |
| 2021/0088776 A1 | 3/2021 | Uyeno et al. | |
| 2021/0091854 A1 | 3/2021 | Uyeno et al. | |

OTHER PUBLICATIONS

"U.S. Appl. No. 17/007,917, Notice of Allowance dated Jan. 10, 2022", 14 pgs.

"U.S. Appl. No. 17/007,917, Response filed Dec. 1, 2021 to Non Final Office Action dated Aug. 3, 2021", 16 pgs.

"U.S. Appl. No. 17/007,917, Supplemental Notice of Allowability dated Apr. 19, 2022", 2 pgs.

"U.S Appl. No. 17/007,917, Non Final Office Action dated Aug. 3, 2021", 35 pgs.

Kim, et al., "Demonstration of large-angle nonmechanical laser beam steering based on LC polymer polarization grating", Proc.. of SPIE vol. 8052 80520T, (May 13, 2011).

"U.S. Appl. No. 16/871,602, Non Final Office Action dated Nov. 9, 2020", 18 pgs.

"U.S. Appl. No. 16/871,602, Notice of Allowance dated Feb. 24, 2021", 5 pgs.

"U.S. Appl. No. 16/871,602, Response filed Feb. 8, 2021 to Non Final Office Action dated Nov. 9, 2020", 12 pgs.

U.S. Appl. No. 17/007,917, filed Aug. 31, 2020, Electronically Steered Inter-Satellite Optical Communication System with Mircro-Electromechanical (MEM) Mircromirror Array (MMA).

U.S. Appl. No. 16/871,602, filed May 11, 2020, Optical Data Communication Using Micro-Electro-Mechanical System (MEMS) Micro-Mirror Arrays.

* cited by examiner

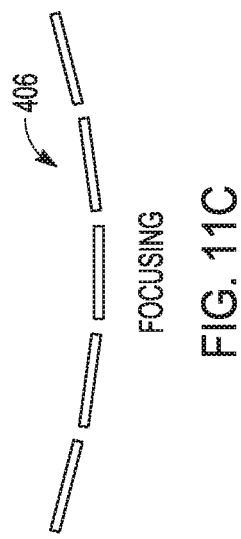
FIG. 11C FOCUSING
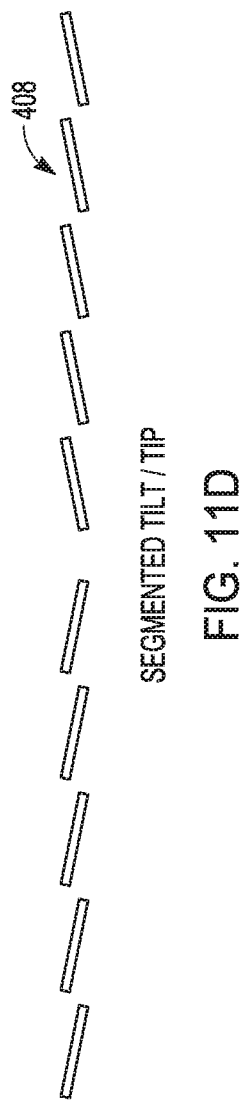
FIG. 11D SEGMENTED TILT / TIP
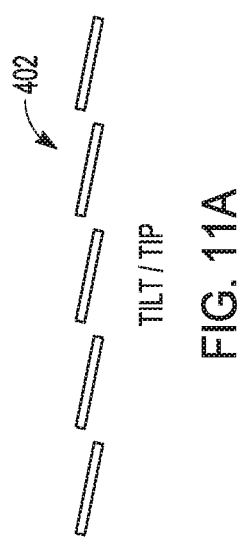
FIG. 11A TILT / TIP
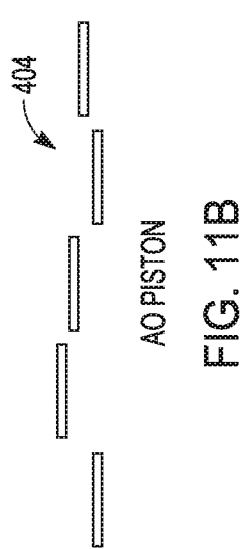
FIG. 11B AO PISTON

OPTICAL NON-UNIFORMITY CORRECTION (NUC) FOR ACTIVE MODE IMAGING SENSORS USING MICRO-ELECTRO-MECHANICAL SYSTEM (MEMS) MICRO-MIRROR ARRAYS (MMAS)

CROSS-REFERENCE TO RELATED APPLICATIONS

This application claims benefit of priority under 35 U.S.C. 119(e) to U.S. Provisional Application No. 62/903,244 entitled "OPTICAL DATA COMMUNICATION USING MICRO-ELECTRO-MECHANICAL SYSTEM (MEMS) MICRO-MIRROR ARRAYS" and filed on Sep. 20, 2019, the entire contents of which are incorporated by reference.

BACKGROUND OF THE INVENTION

Field of the Invention

This invention relates to optical non-uniformity correction (NUC) for active mode imaging sensors, and more particularly to optical NUC for angle of incidence between the scene and imager.

Description of the Related Art

Imaging sensors typically include a pixelated imager that is sensitive to incident photons within a certain spectral band e.g. Near IR (NIR), Short Wave IR (SWIR), Mid Wave IR (MWIR), Long Wave IR (LWIR), visible (VIS) etc., imaging optics having an entrance pupil for receiving light from a scene within a field-of-view (FOV) of the sensor and imaging the FOV onto the imager, and a read out circuit for reading out an image of the FOV within the spectral band at a frame rate. The scene is composed of multiple point sources of light (collimated due to the distance to the scene) at different angles of incidence. The optics focus light from each point source onto the pixelated imager with the angle of incidence mapping to a spatial offset on the imager to form the image. Passive mode sensors detect emissions from the scene in the spectral band of the imager. Active mode sensors use a broad beam laser illuminator to illuminate the scene within the FOV of the sensor with laser energy in the spectral band to increase the signal-to-noise ratio (SNR).

Ideally an imaging sensor should respond uniformly across its FOV. That is the sensor response to a point source of illumination anywhere in the FOV should be the same. However, due to manufacturing issues of the pixelated imager, environmental variations and the radiometry of point sources, there are non-uniformities that exist in imaging sensors that must be corrected. Fixed pattern noise describes the non-uniformity in the response of the individual pixels of the imager itself. Notwithstanding the name, the fixed pattern noise can change with time and operating conditions such as temperature.

The irradiance at the entrance pupil of the imager from isotropic point sources across a plane varies with the $3^{rd}$ power of the cosine of the angle of incidence from the optical axis of the imager to the point source. For a Lambertian point source (such as laser light reflected off objects in a scene), the irradiance varies with the $4^{th}$ power of the cosine (See Chapter 2.3 Radiometric Approximations of The Art of Radiometry, SPIE Press Book, 2009). The angle may have a first component owing to the LOS from the imager to the scene and a second component owing to the spatial position of a point source within the FOV. The $3^{rd}$ or $4^{th}$ power of the cosine functions rolls off rapidly with the angle of incidence. Without correction, the sensor response will be highly non-uniform over the FOV, particularly if the LOS angle is appreciable.

Non-Uniformity Correction (NUC) may be performed as a calibration step at the time of manufacture and periodically in a laboratory setting. A black body source is used to produce flat field illumination across the sensor's FOV. The sensor's response is measured and used to calculate a scale factor for each pixel that is inversely proportional to that pixel's response so that the net response of the sensor is uniform over the FOV. This accounts for both fixed pattern noise and angle of incidence roll off over the FOV. Thereafter, the measured value for each pixel is multiplied by its scale factor, a form of "electronic" gain. An undesirable effect is scaling (increasing) the noise.

It is often desirable to periodically perform a NUC in an operational setting. To accomplish this the imaging sensor is provided with a black body source e.g. a small thermal source or a flat plate placed in the FOV. The sensor's response is measured and used to update the scale factors for each pixel. The operational NUC may account for changes in the fixed pattern noise or angle of incidence due to the LOS from the imager to the scene. In many applications, the LOS is constantly changing. The imaging sensor will lose visibility of the scene during NUC.

Another approach is to utilize a scene-based NUC in which the sequence of images (frames) are filtered and compared to determine and correct the non-uniformity. Scene-based NUC requires the post-processing of frames for filtering and comparison to previous frames. This process is computationally demanding and uses statistics to determine the non-uniformity of the scene, which could introduce errors in the final image. Scene-based NUC maintains visibility of the scene during NUC.

U.S. Pat. No. 9,473,768 entitled "Optical Non-Uniformity Correction (NUC) for Active Mode Imaging Sensors" discloses scanning a laser spot in an overlapping geometrical pattern while modulating a spacing between overlapping laser spots, the size of the spot or dwell time as a function of scan position so that the laser illumination is inversely proportion to the imager response so that the net response is approximately uniform A liquid crystal waveguide (LCWG) may be used to form and scan the laser spot. A LCWG can only steer a very narrow band of wavelengths about a center wavelength across the FOV within a frame time. Each material system e.g., substrates, coatings and liquid crystals, and voltage settings to steer the laser beam are unique to each wavelength. Therefore to accommodate different wavelengths requires different LCWG devices and significant investment in materials, manufacturing, set-up and calibration etc. to design and field each device.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides an active mode image sensor for optical non-uniformity correction (NUC) of an active mode sensor using a Micro-Electro-Mechanical System (MEMS) Micro-Mirror Array (MMA) having tilt, tip and piston mirror actuation to form and scan a laser spot that simultaneously performs the NUC and illuminates the scene so that the laser illumination is inversely proportional to the response of the imager at the scan position.

In different embodiments, the MEMS MMA mirrors are provided with reflective coatings designed to reflect at a single wavelength (narrowband) or multiple discrete wavelengths (broadband). The underlying MEMS MMA remains the same as do the command signals to control actuation of the mirrors for tip, tilt and piston. The reflective coatings can be configured to provide for NUC at a single wavelength or multiple wavelengths.

In an embodiment, the MEMS MMA mirrors are responsive to command signals to tip, tilt and translate the mirrors to modulate as a function of the scan position of the laser spot, a spacing between overlapping laser spots, a size of the laser spot, a dwell time of the laser spot or the amplitude of the laser spot or combinations thereof so that the laser illumination is inversely proportional to the response of the imaging sensor at the scan position of the laser spot.

In an embodiment, the MEMS MMA is responsive to command signals to partition the MMA into a plurality of segments, each segment comprising a plurality of mirrors responsive to command signals to tip, tilt and translate the mirrors to form the laser energy into a laser spot smaller than the FOV and to scan the laser spot over a sub-portion of the portion of the FOV within a frame time so that the laser illumination is inversely proportion to the response of the pixelated imager at the scan position. This can be done, for example, to scan the portion of the FOV in parallel or to independently interrogate different local regions of the scene.

In an embodiment, the MEMS MMA mirrors are responsive to command signals to tip, tilt and translate the mirrors to simultaneously form the laser energy into a plurality of fixed laser spots each smaller than the FOV to instantly illuminate a portion of the FOV so that the laser illumination is inversely proportional to the response of the pixelated imager in what may be referred to as an "instantaneous NUC."

In an embodiment, the active mode imaging sensor implements a multi-spectral NUC. In one instance, the mirrors are provided with a broadband reflective coating and the laser source produces laser energy that spans the broadband. In another instance, the MEMS MMA is partitioned into sections each comprising a plurality of mirrors, wherein the mirrors in the different sections comprise reflective coatings designed to reflect at different wavelengths within the specified band. Each section generates one or more laser spots at the corresponding wavelength.

In an embodiment, the piston capability is used to phase-correct the laser spots to maintain coherence across the wavefront at the scene for either single or multi-spectral applications. Piston capability is generally used to focus/defocus the laser energy to form and change the size of the laser spot.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 11A through 11D illustrate different TTP actuations of mirrors to scan or focus a spot, provide adaptive optics (AO) correction across the wavefront of a spot and to scan multiple laser spots.

DETAILED DESCRIPTION OF THE INVENTION

Figure 1A:
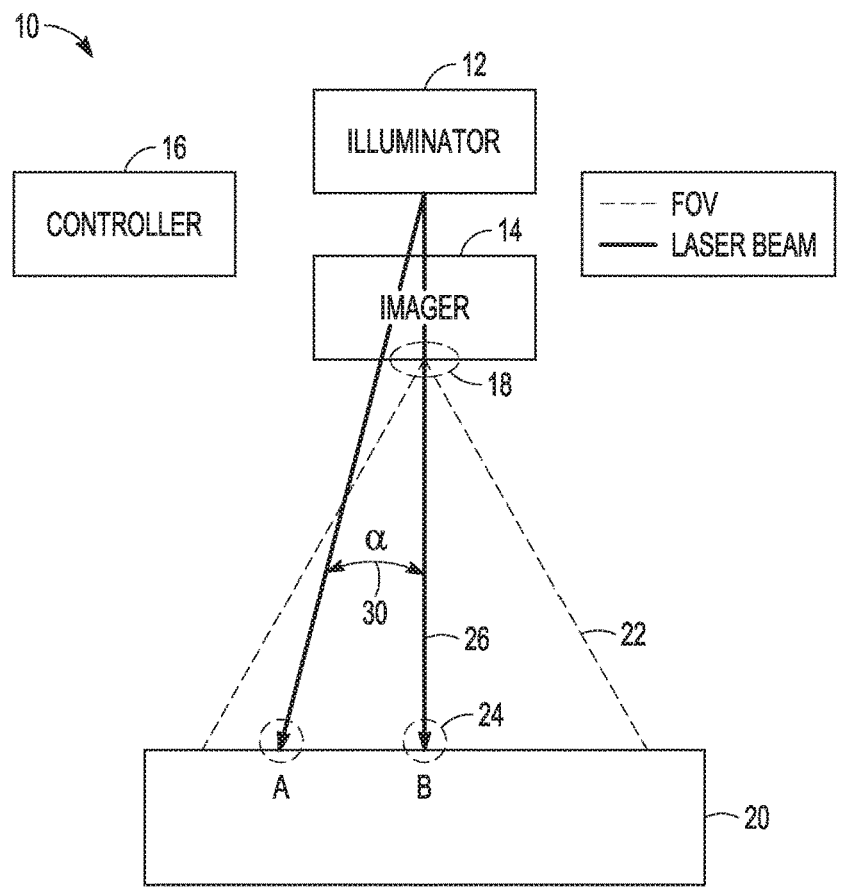
FIGS. 1A and 1B are a block diagram and scan pattern of an embodiment of an active mode sensor that scans a laser spot so that the laser illumination of the scene is inversely proportion to the response of the imager at the scan position.
Figure 1B:
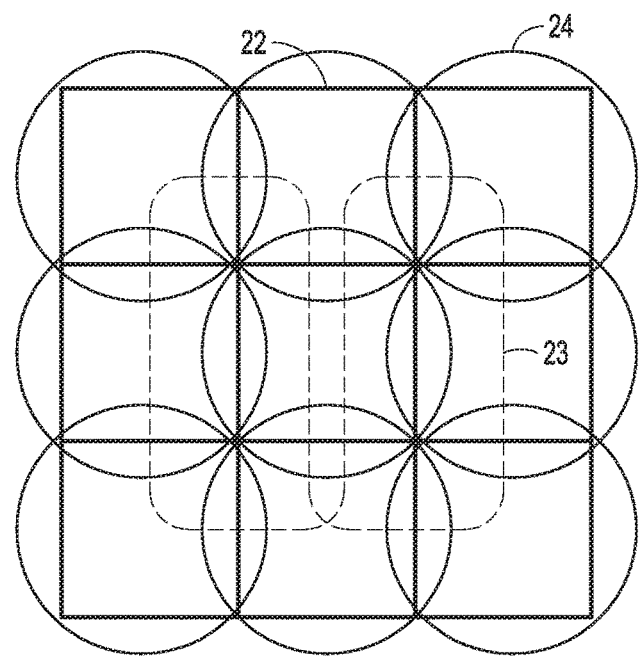

An optical non-uniformity correction (NUC) of an active mode sensor scans a spot over a portion of the sensor's FOV within a frame time so that the net response of the sensor is approximately uniform. Scanning the laser spot simultaneously performs the NUC and provides the illumination of the FOV for imaging the scene. The response of the sensor's imager will fall off with an increasing angle of incidence. In some cases, the illuminated portion of the scene will form a Lambertian point source whose illuminations rolls off as the $4^{th}$ power of the cosine of the angle of incidence. The angle of incidence may include a variable line-of-sight (LOS) component from the imager to the scene and a fixed FOV component across the scene within the FOV. The laser spot is suitably scanned in an overlapping geometrical pattern relative to a line-of-sight of the sensor's imager while modulating a spacing between overlapping laser spots, the size of the spot, a dwell time of the laser spot or the energy of the laser spot or combinations thereof as a function of the scan position of the laser spot so that the laser illumination is inversely proportional to the imager response at the scan position of the laser spot. A MEMS MMA having tip, tilt and piston ("TTP") independent actuation of each micro mirror may be used to form and scan the small laser spot over the FOV within the frame time.

Optical NUC of active mode sensors has several advantages when compared to the conventional electronic NUC. First, the scanned laser spot simultaneously provides both the NUC and the active illumination of the scene. Therefore, the additional black body source or flat field element usually required for NUC during operation is not needed. Second, because the NUC and active illumination are coincident, visibility of the scene is not lost to perform the NUC. Third, scanning a spot allows one to achieve the same SNR with less total power or greater SNR with the same total power of flood or flash illumination. Fourth, optical NUC limits noise scaling. Instead of multiplying the noise, an increase in optical power increases the noise as a square root. As a result, the NUC'd image will have an even higher SNR. The SNR advantage may be quite pronounced for Lambertian point sources whose illumination rolls off as the $4^{th}$ power of the cosine of the angle of incidence, particularly in cases where the LOS component is significant.

The TTP MEMS MMA provides significant advantages over LCWG for forming and scanning the laser spot. First, the MEMS MMA can be modified for different wavelengths by simply using a different reflective coating. Neither the material system or construction of the MEMS MMA need be changed and the voltage settings to actuate the mirrors are wavelength independent. This is a considerable manufacturing advantage. Second, the MEMS MMA can provide sufficient resolution to "oversample" the pixelated imager to ensure very accurate illumination response. Third, the MEMS MMA can be partitioned into segments to form and scan multiple laser spots simultaneously to scan the FOV or to independently interrogate different local regions of the scene. Fourth, the MEMS MMA can simultaneously form a plurality of fixed laser spots to instantly illuminate the FOV. Fifth, the MEMS MMA can be partitioned into sections in which the mirrors are provided with reflective coatings at different wavelengths in order to form and scan laser spots at different wavelengths. Sixth, the mirrors may be controlled to provide wave correction to maintain coherence of the illumination at the scene.

Referring now to FIGS. 1A-1B and 2A-2C, an embodiment of an active mode imaging sensor 10 includes a laser illuminator 12 provided with a Tip/Tilt/Piston MEMS MMA, an imager 14 and a controller 16 e.g. one or more processors. For simplicity the laser illuminator 12 is co-boresighted with the pixelated imager 14. If illuminator is not co-boresighted it will induce a bias to the angle than can be corrected with measured ranges. Imager 14 includes optics having an entrance pupil 18 configured to receive reflected light from a laser illuminated scene 20 over a FOV 22 and image the light onto the pixelated imager. Laser illuminator 12 uses the MEMS MMA to form and scan a laser spot 24 over FOV 22 in a dynamic scan pattern 23 within a frame time. The pattern is suitably a fixed overlapping geometrical pattern 23 relative to the LOS of the imager. The pattern may be fixed relative to the LOS or varied based on an external input such as to highlight a certain local region within the FOV. Controller 16 controls the laser illuminator, hence MEMS MMA to form and scan the laser spot.

In this embodiment a LOS 26 from the sensor to scene is normal to scene 20. Hence, the LOS does not contribute to the angle of incidence a 30. Therefore, a point source at the center B of FOV 22 has a zero angle of incidence. A point source at a position A in FOV 22 has an angle of incidence determined by its position in the FOV.

Figure 2A:
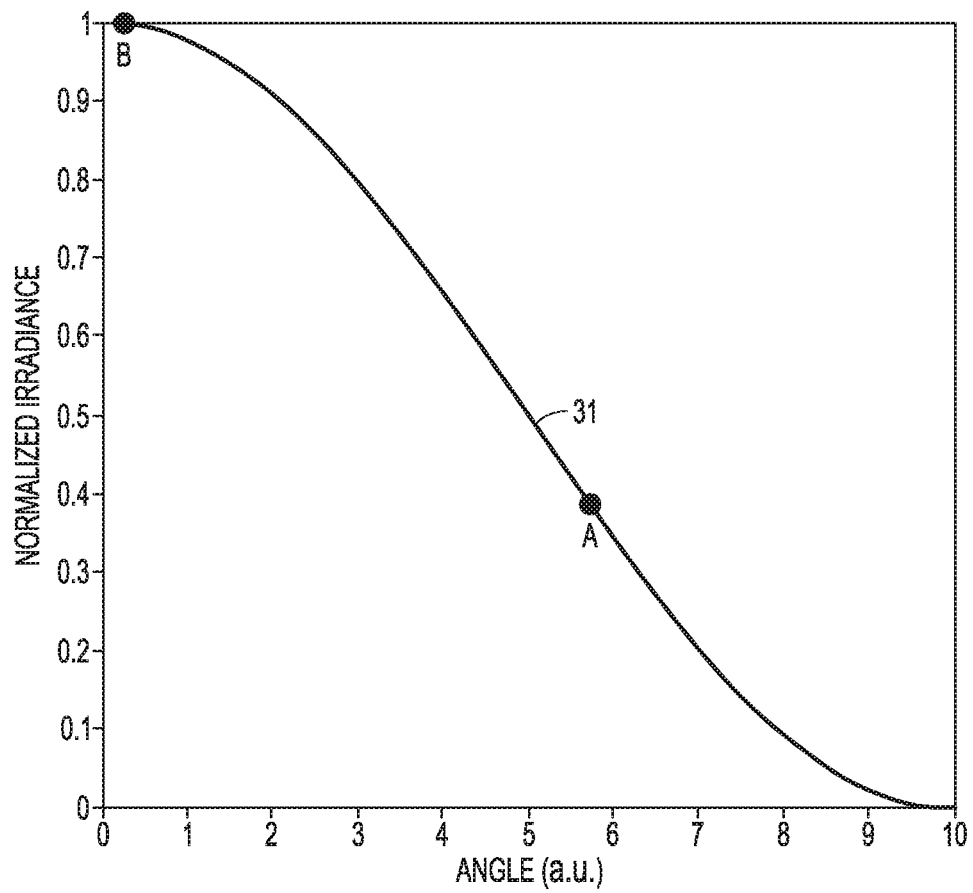
FIGS. 2A through 2C are plots of normalized irradiance versus angle of incidence, relative illumination as a function of scan position and a net sensor response that is approximately uniform over the FOV.

Assuming Lambertian point sources, the normalized radiance 31 received at the entrance pupil of the imager decreases as the $4^{th}$ n power of the cosine of the angle of incidence a 30 as shown in FIG. 2A. In general, the LOS from the sensor to the scene will contribute to the angle of incidence. For example, if the LOS is 20 degrees, the point source at the center B of the FOV will be at 20 degrees on the normalized radiance plot and the point source at position A will be offset from that position. Typical FOV may be 2-8 degrees (+/-1-4 degrees) for tracking, but larger for surveillance applications.

Figure 2B:
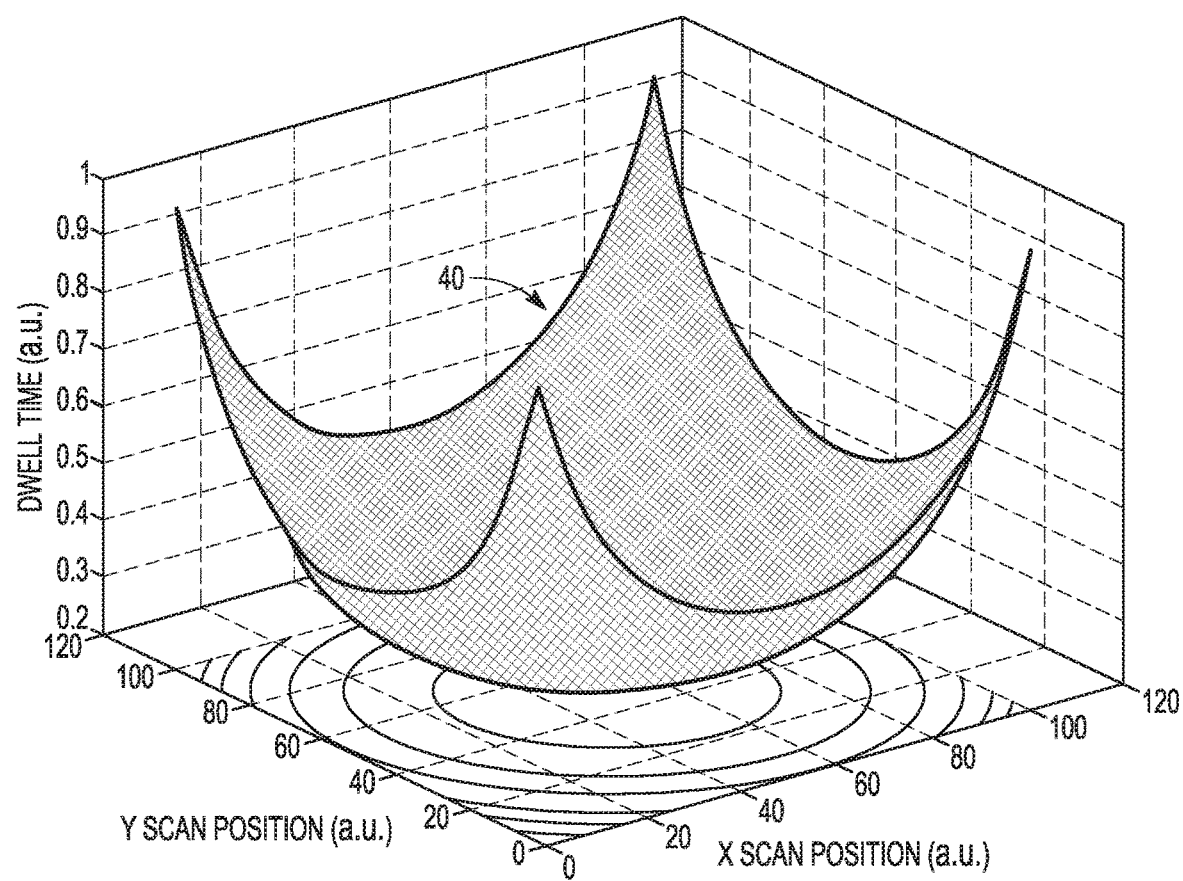
Figure 2C:
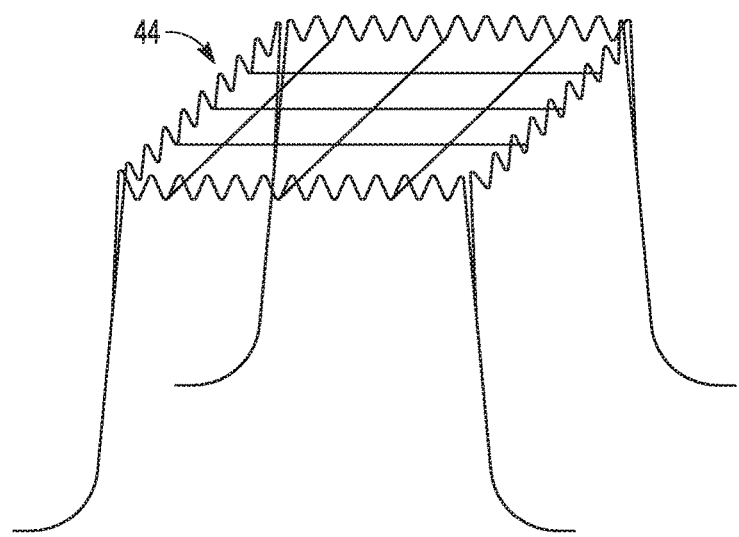

As shown in FIG. 2B, to correct for the roll off in normalized radiance due to the radiometry of the angle of incidence of Lambertian point sources, the laser illuminator scans the laser spot over the FOV to a relative illumination 40 that is inversely proportional to the response of the pixelated imager at the scan position of the laser spot. The spot size and scan pattern will determine how closely the actual illumination over the FOV will approximate the ideal relative illumination 40. Smaller spots sizes may more accurately reproduce the desired illumination. However, small spot sizes are more difficult to form and require higher scan rates to cover the FOV, or a portion thereof, in a certain frame time. The TTP MEMS MMA provides both the spot size, resolution and scan rates necessary to accurately reproduce the desired illumination to provide a net response 44 of the sensor that is approximately uniform over the FOV or a scanned portion thereof as shown in FIG. 2C. Typical, spot sizes may be between 2 and 25% of the FOV.

The imager response may be determined by the angle of incidence owing to the LOS from the imager to the scene or to spatial variations across the FOV or both. In some cases the imager response could be a known fixed pattern noise. In this case, the spot size would be set to the pixel size. Due to possible scan rate limitations, correction for fixed pattern noise may be limited to local regions of the FOV and not available over the entire FOV. Other sources of non-uniformity such as temperature, detector lifetime, or the like may exist. As long as the non-uniformity can be characterized, the scan pattern of the laser spot may be adapted to correct for that non-uniformity.

The laser illuminator 12 utilizes the capabilities of a Micro-Electro-Mechanical System (MEMS) Micro-mirror Array (MMA) comprising a plurality of independently and continuously controllable mirrors to form and steer the laser spot(s). Each mirror is capable of "Tip" (rotation about an X-axis), "Tilt" (rotation about a Y-axis) and "Piston" (translation along a Z-axis, perpendicular to the XY plane) where the X, Y and Z are orthogonal axes in a three-dimensional space. The independently controllable mirrors can be adaptively segmented to form any number of laser spots, adjust the size/power of a given spots and generate multi-spectral laser spots. The "Tip", "Tilt" and "Piston" capabilities are used to form and steer the spot. The MMA is preferably capable of steering an output laser beam over a steering range of at least −10°×+100 in tip and tilt and +/−10 microns piston at a rate of at least 1 KHz (<1 millisecond). In some embodiments, the number of mirrors exceeds the number of pixels in the imager in which case the MMA "oversamples" the imager. This can be beneficial because it allows the group of pixels to change the wavefront for specific locations. This feature enables focusing or defocusing across pixels or regions of pixels, which best corrects for the non-uniform response of the imager or environment. The Piston function is also useful to perform wavefront correction for a given output beam when a segment includes multiple mirrors that oversample the laser spot. Further, the MEMS MMA must have a sufficient number of mirrors, mirror size/resolution, fill factor, range of motion, response time, response accuracy and uniformity across the array. One such MEMS MMA is described in U.S. Pat. No. 10,444,492 entitled "Flexure-Based, Tip-Tilt-Piston Actuation Micro-Array", which is hereby incorporated by reference. This MEMS MMA is currently being commercialized by Bright Silicon technologies for "digitally controlling light."

Referring now to FIGS. 3 and 4A-4C, an embodiment of an active mode imaging sensor 100 for reading out NUC'd images of a scene 102 at a frame time includes an imager 104, an illuminator 106 and a controller 108.

Imager 104 includes optics 110, a focal plane array (FPA) 112 and a read out integrated circuit (ROIC) 114. Optics 110 have an entrance pupil configured to receive reflected light from the laser illuminated scene over a FOV and image the light onto the FPA, which accumulates the incident photons over a frame time. The FPA may be Silicon based for visible and NIR applications, InGaAs for SWIR, HgCdTe for MWIR or a bolometer configuration for LWR. The ROIC reads out a NUC'd image every frame time.

Illuminator 106 includes a laser source 116, optics 118 and a MEMS MMA 120. Laser source 116 supplies laser energy in a specified spectral band. The spectral band may be "narrowband" that includes essentially a single wavelength or may be "broadband" and include multiple discrete wavelengths. Optics 118 couple the laser energy 117 via a fold mirror 119 to a TTP MEMS MMA 120. The TTP MEMS MMA 120 responds to voltage drive signals to tip/tilt/piston individual mirrors 121 to form the laser energy into a laser spot(s) 123 and to scan the spot in an overlapping scan pattern (dynamic or static) to provide a specified relative illumination over the FOV, or a portion of the FOV, in a frame time.

Controller 108 includes a command and synchronization electronics 122 that receives a start of frame/row from the ROIC 114 and generates analog drive signals that specific the scan pattern and a MEMS MMA controller 124 that converts the analog drive signals to the voltage drive signal applied to the MEMS MMA 120. These command and synchronization electronics 122 may also synchronize the pulses from the laser source 116. Asynchronous laser pulse operation is possible. Together the analog drive signals and voltage drive signals may be considered as "command signals" provided by one or more processors.

As previously discussed, the angle of incidence, hence FPA response, includes a LOS component and a FOV component. The FOV component can be calculated directly by knowing the scan position of the laser spot within the FOV. The LOS may be provided by an external source to the sensor e.g. telemetry on board a platform. This "feedback" technique can be used to track and correct the LOS component.

Figure 5:
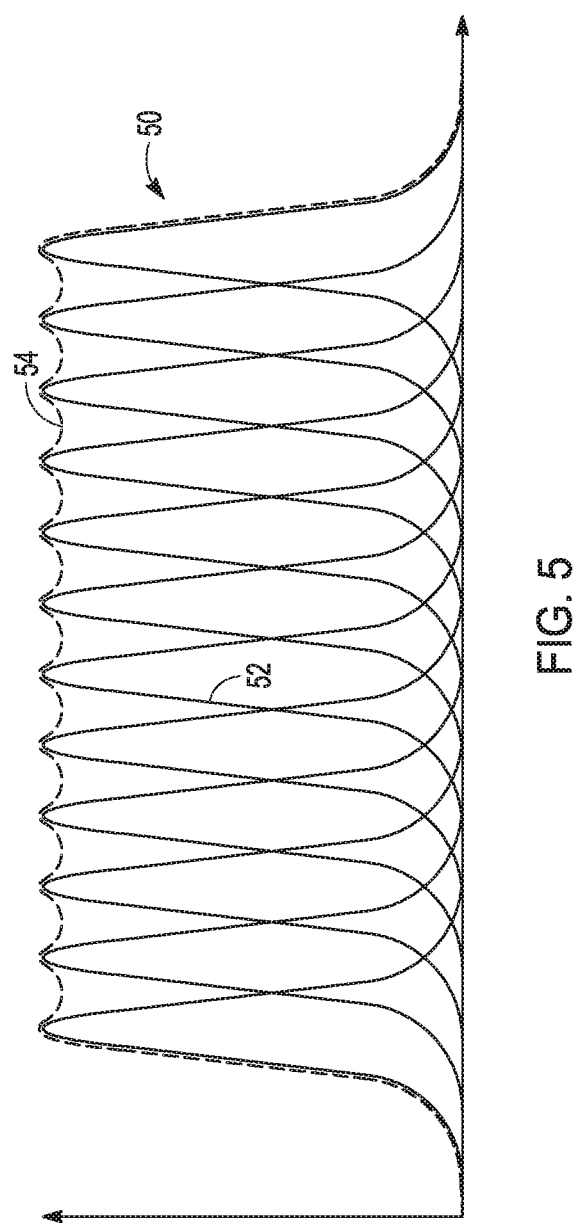
FIG. 5 is a plot of a scan pattern having a nominal spacing, amplitude and dwell time that sum to provide approximately uniform relative illumination over the sensor FOV.

Referring now to FIGS. 5 and 6A through 6D, there exist multiple parameters of the laser spot(s) and overlapping scan pattern, dynamic or static that may be controlled individual or in combination to produce the relative illumination to provide optical NUC. FIG. 5 depicts an overlapping scan pattern 50 of a laser spot 52 configured to produce an approximately uniform illumination 54 over the FOV within a frame time. In this scan pattern, the spacing, size, energy (amplitude) and dwell time of the laser spot 52 all have nominal and fixed values throughout the scan pattern 50. The desired relative illumination is approximated by varying one or more of these parameters over the scan pattern as a function of the scan position of the laser spot.

Figure 6A:
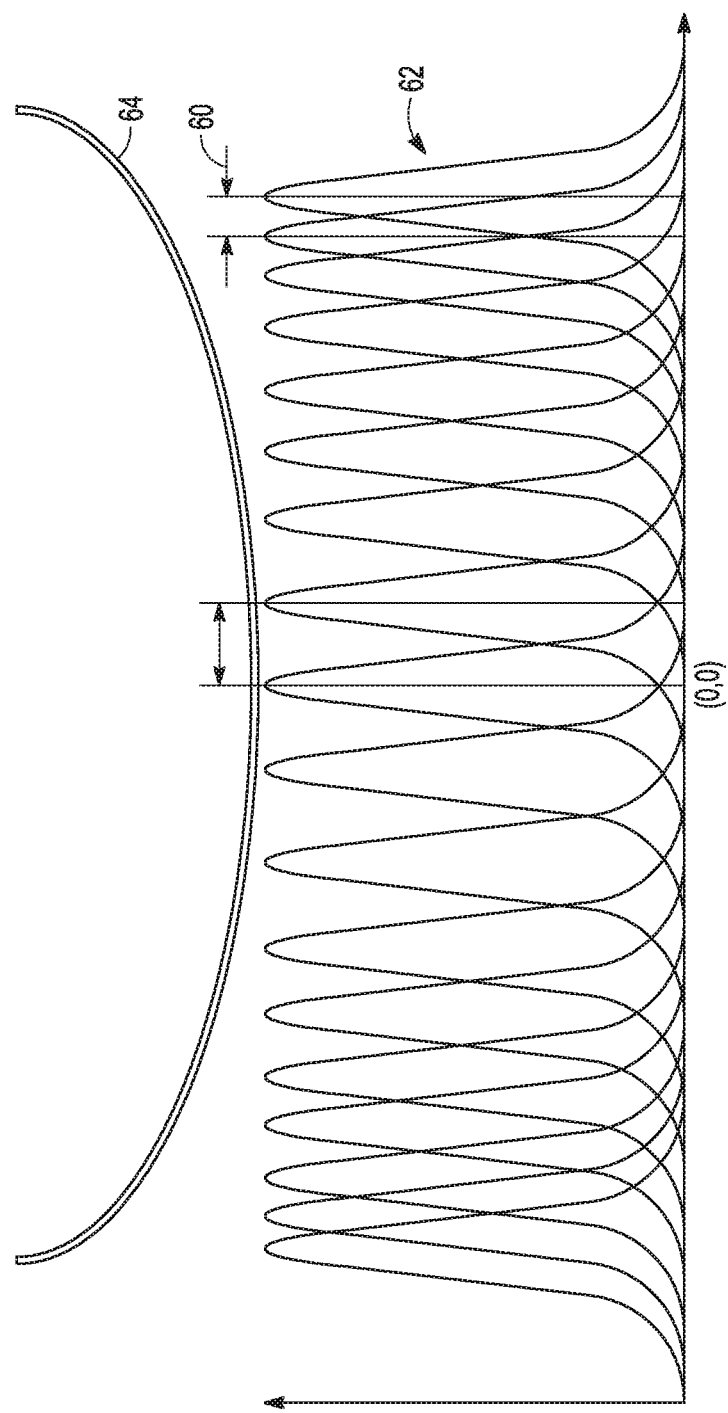
FIGS. 6A, 6B, 6C and 6D are different embodiments that illustrate controlled spacing, spot size, amplitude and dwell time that sum to provide relative illumination as function of scan position to provide an approximately uniform sensor response over the FOV.

As shown in FIG. 6A, a spacing 60 between laser spots 62 is varied as a function of scan position to produce a relative illumination 64 that is inversely proportion to the imager response. The spacing 60 gets closer and closer together as the scan position from the center of the FOV increases, hence angle of incidence to the imager's entrance pupil increases so that the laser spots 62 sum together to provide more illumination.

Figure 6B:
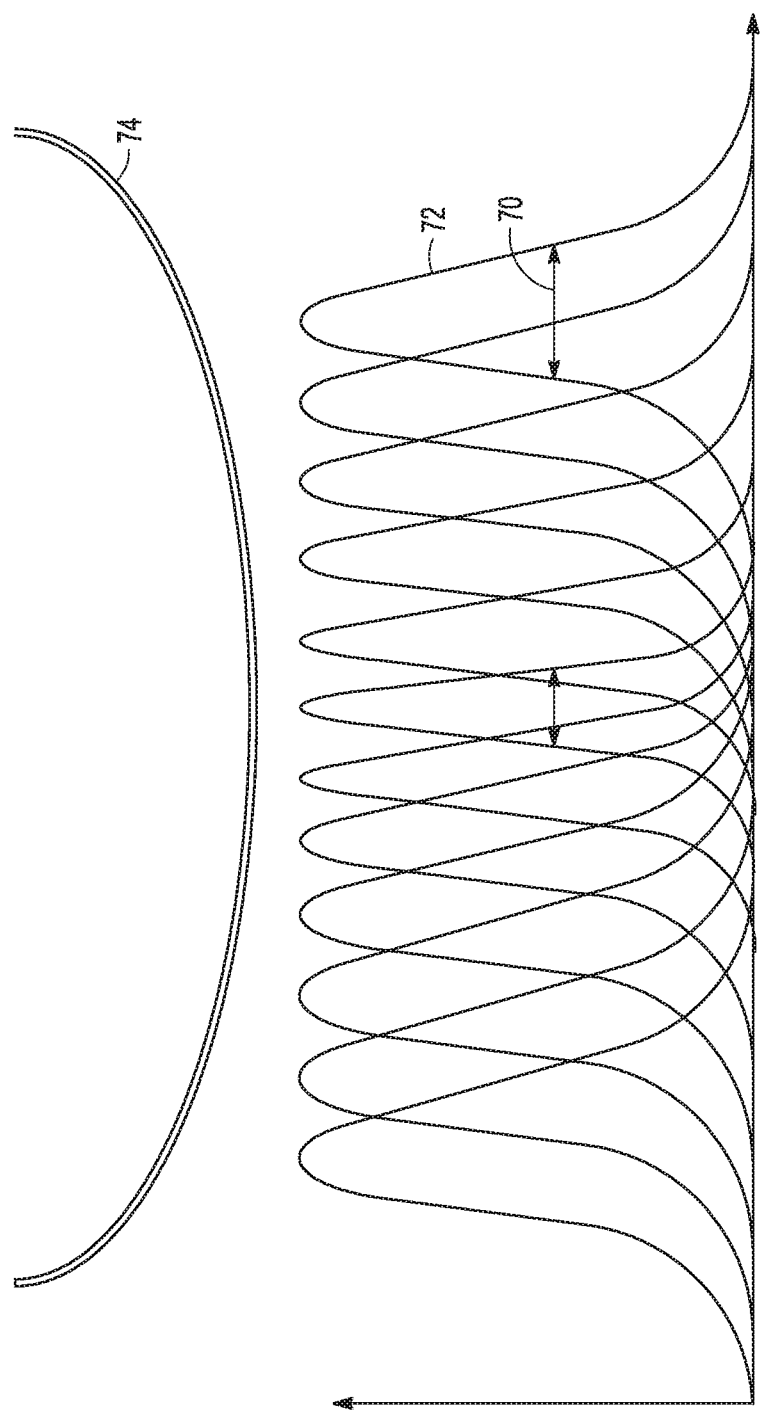

As shown in FIG. 6B, a size (width) 70 between laser spots 72 is varied as a function of scan position to produce a relative illumination 74 that is inversely proportion to the imager response. The size 70 gets wider and wider as the scan position from the center of the FOV, hence angle of incidence to the imager's entrance pupil increases so that the laser spots 72 sum together to provide more illumination.

Figure 6C:
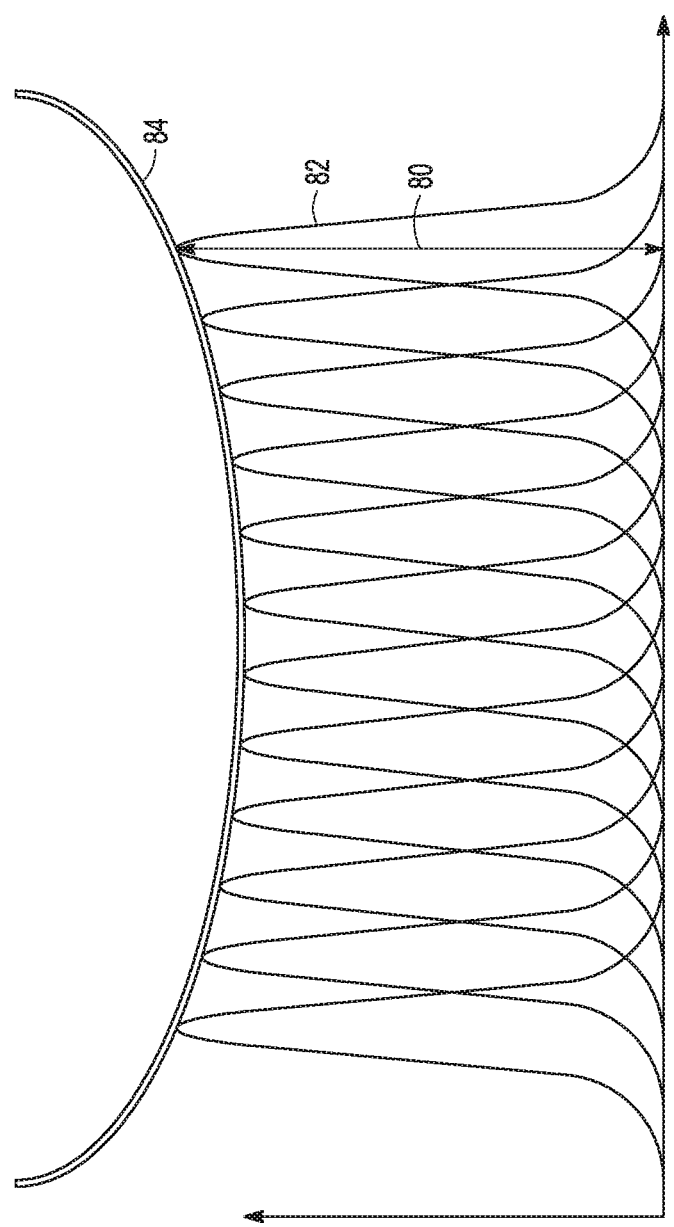

As shown in FIG. 6C, an amplitude 80 of a laser spot 82 is varied as a function of scan position to produce a relative illumination 84 that is inversely proportion to the imager response. The amplitude may be varied by directly controlling the laser source or by using the MEMS MMA. The amplitude 80 gets larger and larger as the scan position from the center of the FOV increases, hence angle of incidence to the imager's entrance pupil increases so that the laser spots 62 sum together to provide more illumination.

Figure 6D:
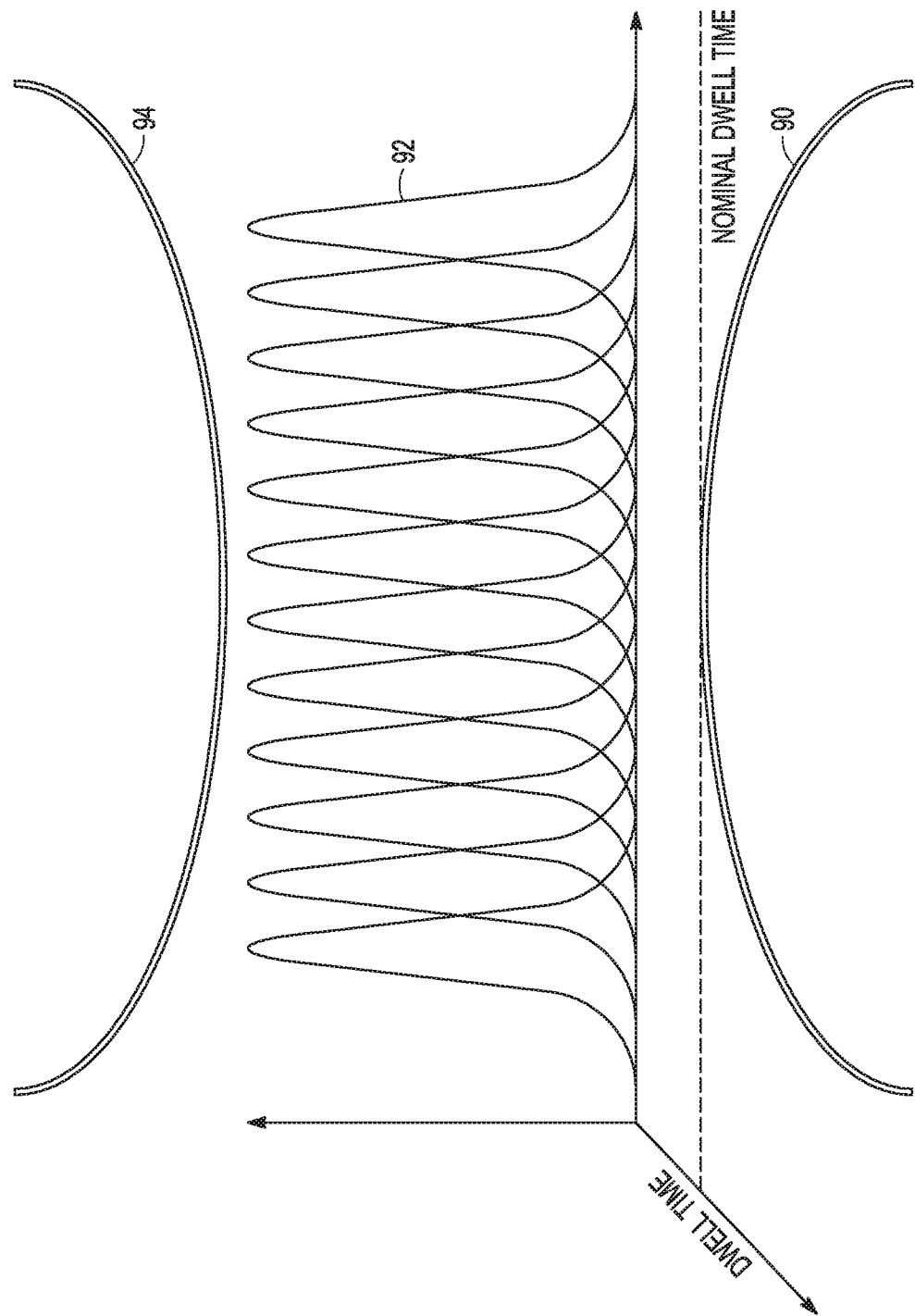

As shown in FIG. 6D, a dwell time 90 of a laser spot 92 is varied as a function of scan position to produce a relative illumination 94 that is inversely proportion to the imager response. The dwell time 90 gets longer and longer as the scan position from the center of the FOV increases, hence angle of incidence to the imager's entrance pupil increases so that the laser spots 94 sum together to provide more illumination.

Multiple parameters may be controlled to provide the desired relative illumination for each frame time. For example, the laser power (amplitude of the laser spot) may be varied to correct for the LOS component of the angle of incidence. In some cases, the LOS component may vary relative slowly allowing for direct control of laser power. One of the other parameters i.e. spacing, spot size or dwell time may be varied to correct for the FOV component of the angle of incidence. The FOV component may vary relative quickly with the scan rate within each frame time.

Figure 7:
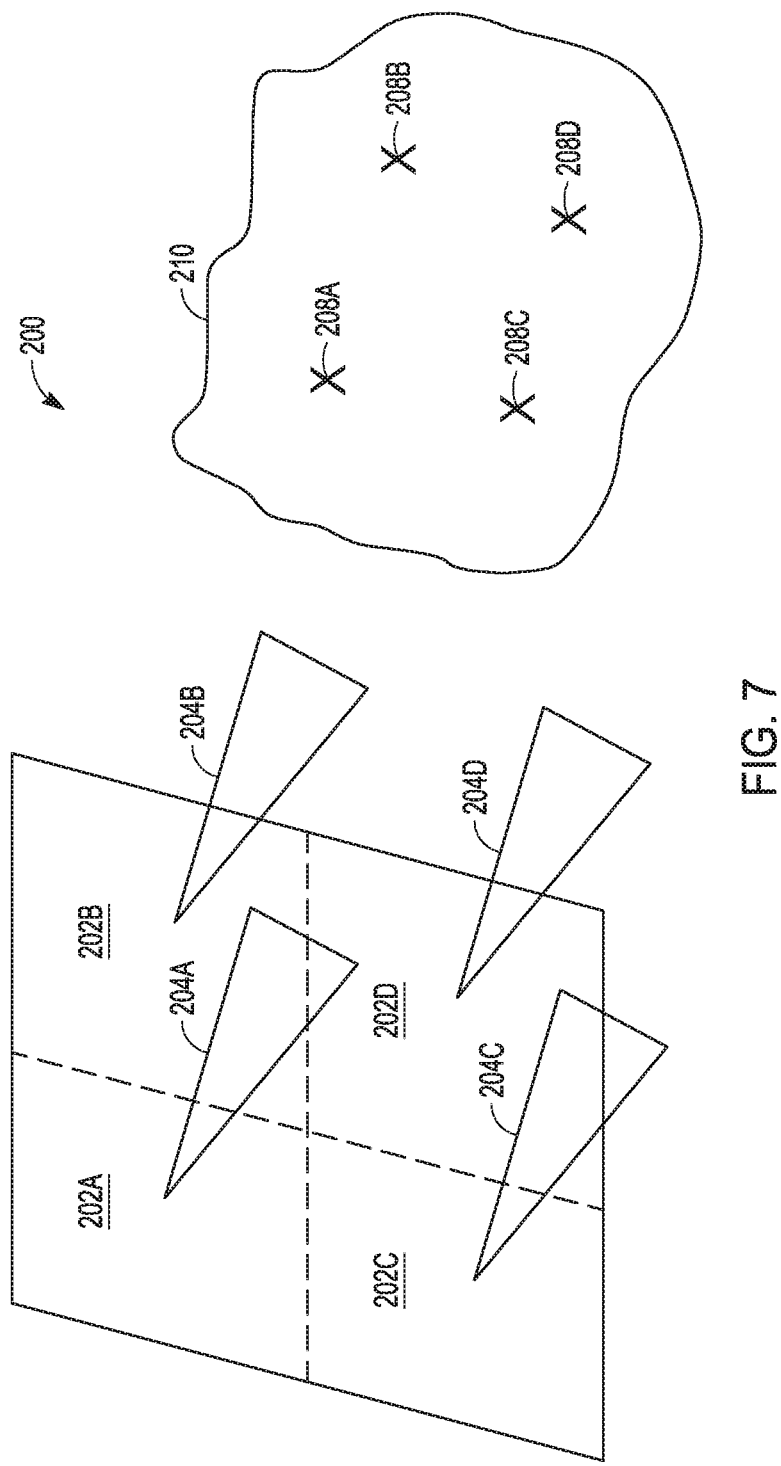
FIG. 7 is an embodiment of a TTP MEMS MMA partitioned into multiple segments to independently form and scan multiple laser spots.

Referring now to FIG. 7, in an embodiment, a MEMS MMA 200 is partitioned into four segments 202A, 202B, 202C and 202D in response to command signals. The segments do not need to be equally sized, can be any portion of the array and can be changed on the fly in number, size or location. In response to command signals, the MEMS MMA controls the plurality of mirrors in each segment to independent form and scan laser spots 204A, 204B, 204C and 204D to illuminate different portions of the FOV so that the laser illumination is inversely proportional to the response of the imager at the scan position. This may be done, for example, to scan different portions of the FOV in parallel to accommodate high frame rates. Alternately, the laser spots can be used to interrogate different local areas 208A, 208C, 208D and 208D of a scene 210.

Figure 8A:
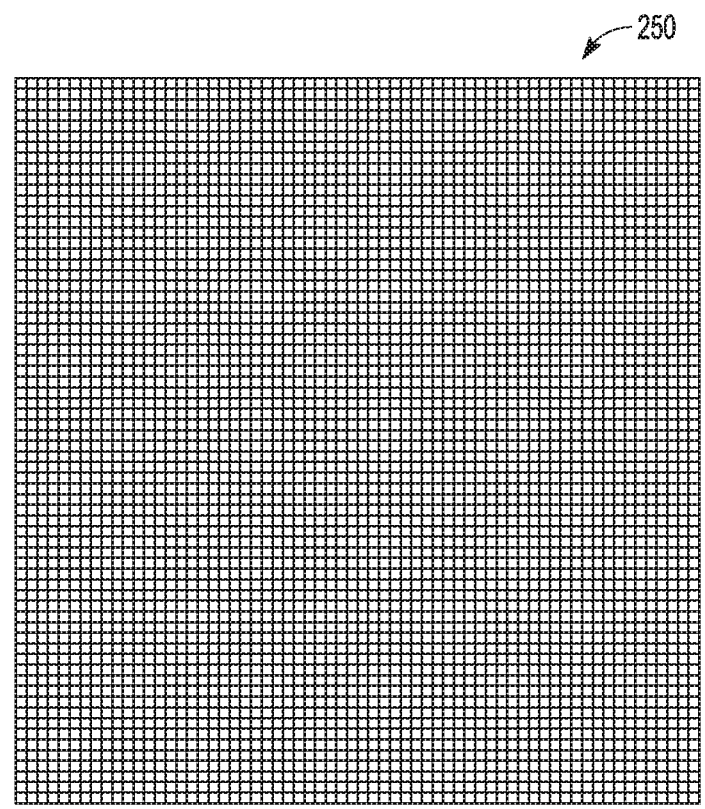
FIGS. 8A and 8B are diagrams of an embodiment of a TTP MEMS MMA configured to simultaneously form a plurality of fixed laser spots to instantly illuminate the FOV so that the illuminator is inversely proportional to imager responsive.
Figure 8B:
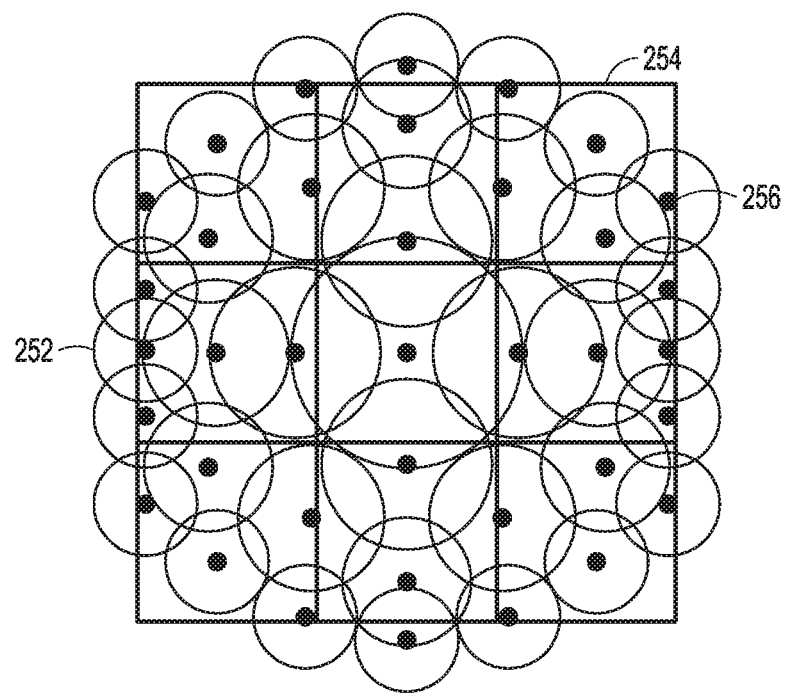

Referring now to FIG. 8, in an embodiment, a MEMS MMA 250 is responsive to command signals to tip, tilt and translate the mirrors to simultaneously form the laser energy into a plurality of fixed laser spots 252 each smaller than the FOV 254 and center at different positions 256 in the FOV to instantly illuminate a portion of the FOV so that the laser illumination is inversely proportion to the response of the pixelated imager in what may be referred to as an "instantaneous NUC". In this embodiment, a single or multiple laser spots that are swept across the FOV in a moving scan pattern are replaced by a plurality of laser spots 252 that are fixed in the FOV. In some embodiments, the number of mirrors exceeds the number of pixels in the imager in which case the MMA "oversamples" the imager, which allows for wavefront correction.

Figure 9:
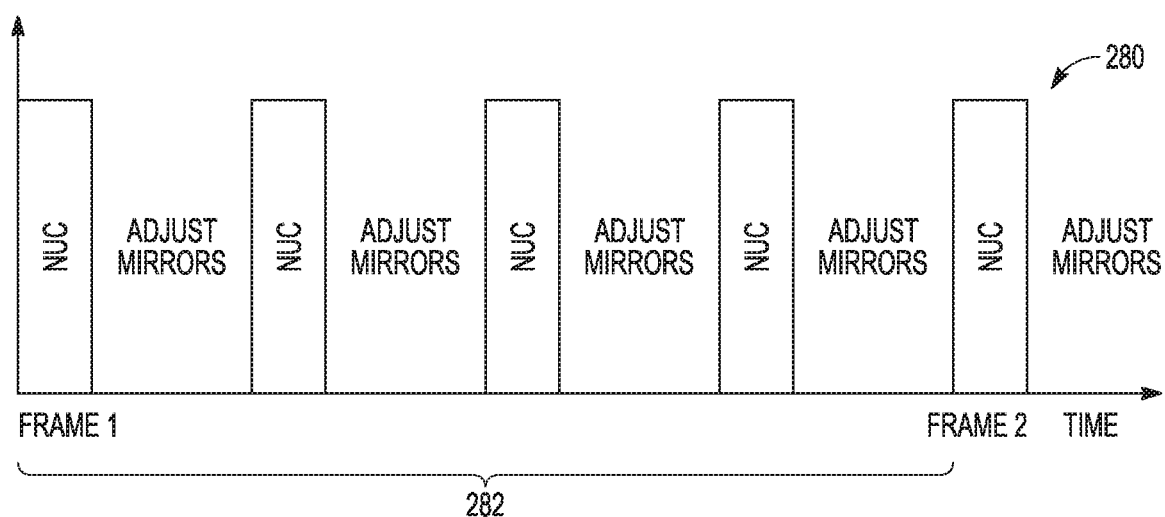
FIG. 9 is an embodiment of a timing diagram in which TTP actuation is performed between laser pulses.

As shown in FIG. 9, the NUC, scanned or instantaneous, can be used in coordination with a laser source that emits laser energy in a sequence of pulses 280 with multiple pulses per frame 282. Between pulses, the MEMS MMA responds to command signals to tip, tilt and translate the mirrors to the positions to form and scan the laser spot allowing time for the mirrors to settle to the specified position. This can be used to hit multiple discrete locations per frame so that each local region gets maximum power per pulse.

The MEMS MMA also provides the capability to perform a multi-spectral NUC on the image. In one embodiment, the laser source generates broadband laser energy including multiple discrete wavelengths. The mirrors are provided with a reflective coating that spans those wavelengths to provide high reflectively. As such, each laser spot is a multi-spectral broadband beam. In another embodiment, the MMA is partitioned into sections. The mirrors in each section are provided with a reflective coating for a particular (and different) wavelength within the broadband. Each section is then controlled to generate one or more laser spots at its corresponding wavelength, which can be used to interrogate the same or different portions of the FOV as desired. This approach allows for wavefront correction to provide "coherence" at the scene. A single broadband laser source may illuminate the entire MMA or multiple laser sources at the corresponding wavelengths can be used to illuminate each section.

Figure 10B:
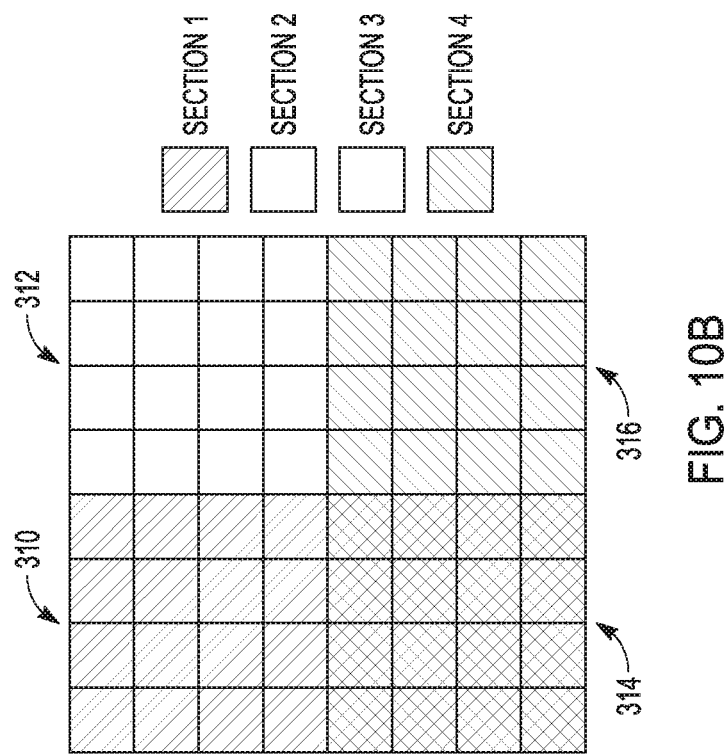
FIGS. 10A and 10B are an embodiment of a TTP MEMS MMA partitioned into multiple sections in which the mirrors are provided with reflective coatings having different wavelengths to form and scan laser spots at the different wavelengths.
Figure 10A:
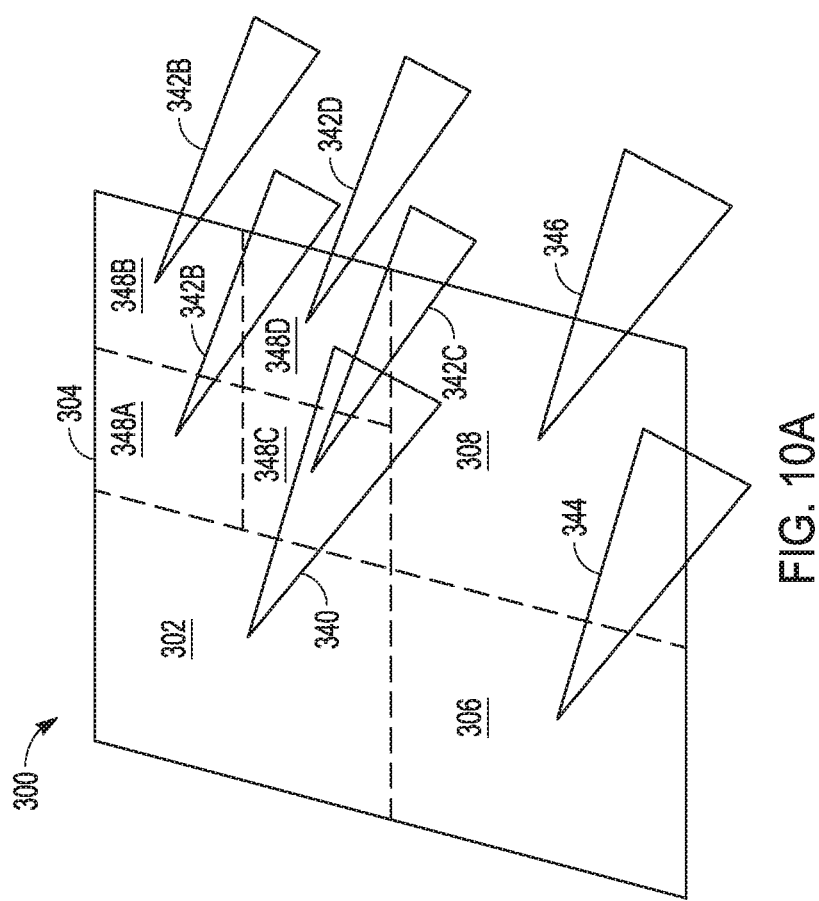

Referring now to FIGS. 10A and 10B, in an embodiment, a MEMS MMA 300 is partitioned into, for example, four sections 302, 304, 306 and 308, one each for a different discrete wavelength within a broadband. The sections do not need to be equally sized and can be any portion of the array based on the number of targets supported for each mode. The mirrors in each section are provided with reflective coatings 310, 312, 314 and 316 at the corresponding center wavelength. In response to command signals, the MEMS MMA 300 partitions each section in accordance with the target list to generate output laser beams 340, 342, 344 and 346 for the corresponding discrete wavelength. Each section may be further partitioned into multiple segments 348A-348D, each segment being controlled to form and scan a laser spot 342a-342d at the corresponding wavelength. In response to command signals, the MEMS MMA may form and scan the laser spots to be coincident on the same scan position in the FOV or to interrogate different local regions of the scene. Furthermore, the "piston" capability can be used to adjust the phase of the different spectral components to maintain coherence of the wavefront of the laser illumination at the scene.

Referring now to FIGS. 11A-11D, an exemplary mirror is responsive to command signals to tip and tilt each mirror about X and Y orthogonal axes, respectively, and to translate each mirror in the Z orthogonal to the XY plane containing, called "piston". The mirrors in a given segment may be tilted/tipped 402 all in the same direction to steer an output beam. The piston function providing for translation of the mirror in the Z axis may be used to perform wavefront correction 404 across the output laser beam. The wavefront may be corrected for atmospheric distortion e.g. Adaptive Optics (AO) Piston to maintain coherence at the scene for single wavelength or multi-spectrum beams. The tip/tilt and piston functions may be used to provide focusing 406 of the laser energy to form the spot. The wavefront correction or focusing may be superimposed on top of the tilt/tip that steers the laser spot. The mirrors in different segments may have different tilt/tip 408 to independently steer the laser spots or any combination of tip/tilt, piston, AO and focusing.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. An active mode imaging sensor, comprising:
an imaging sub-system, comprising
a pixelated imager having a non-uniform response over a specified band of wavelengths,
optics having an entrance pupil configured to receive light from a laser illuminated scene over a field-of-view (FOV) and image the light onto the pixelated imager, and
a circuit for reading out a Non-Uniformed Corrected (NUC'd) image frcxn the pixelated imager at a frame time,
an illumination sub-system, comprising
a Micro-Electro-Mechanical System (MEMS) Micro-mirror Array (MMA) comprising a plurality of independently and continuously controllable mirrors to tip and tilt each mirror about first and second orthogonal axes and to translate each mirror in a third axis orthogonal to a plane containing the first and second orthogonal axes;
a laser source for generating laser energy at one or more wavelengths within the specified band in a sequence of multiple pulses per frame to illuminate the MEMS MMA; and
one or more processors configured to generate command signals to tip, tilt and translate the mirrors between pulses to form the laser energy into a laser spot smaller than the FOV and to scan the laser spot over a portion of the FOV within a frame time so that the laser illumination is inversely proportional to the response of the pixelated imager at the scan position to correct for the imager's non-uniform response over the scanned portion of the FOV.

2. The active mode imaging sensor of claim 1, wherein the MEMS MMA mirrors are responsive to command signals to tip, tilt and translate the mirrors to modulate as a function of the scan position of the laser spot, a spacing between overlapping laser spots, a size of the laser spot, a dwell time of the laser spot or the amplitude of the laser spot or combinations thereof so that the laser illumination is inversely proportional to the response of the imaging sensor at the scan position of the laser spot.

3. The active mode imaging sensor of claim 1, wherein the MEMS MMA mirrors are responsive to command signals to tip, tilt and translate the mirrors to provide coherence of a corrected wavefront of the laser illumination at the scene.

4. The active mode imaging sensor of claim 1, wherein the MEMS MMA mirrors comprise a reflective coating designed to reflect the one or more wavelengths within the specified band.

5. The active mode imaging sensor of claim 1, wherein the MFMS MMA comprises a plurality of mirrors per imager pixel.

6. The active mode imaging sensor of claim 1, wherein the MEMS MMA is responsive to command signals to partition the MMA into a plurality of segments, each segment comprising a plurality of mirrors responsive to command signals to tip, tilt and translate the mirrors to form the laser energy into a laser spot smaller than the FOV and to scan the laser spot over a sub-portion of the portion of the FOV within a frame time so that the laser illumination is inversely proportion to the response of the pixelated imager at the scan position.

7. The active mode imaging sensor of claim 6, wherein the plurality of laser spots together scan in parallel the portion of the FOV.

8. An active mode imaging sensor, comprising:
an imaging sub-system, comprising
a pixelated imager having a non-uniform response over a specified hand of wavelengths,
optics having an entrance pupil configured to receive light from a laser illuminated scene over a field-of-view (FOV) and image the light onto the pixelated imager, and
a circuit for reading out a Non-Uniformed Corrected (NUC'd) image from the pixelated imager at a frame time,
an illumination sub-system, comprising
a Micro-Electro-Mechanical System (MEMS) Micromirror Array (MMA) comprising a plurality of independent) and continuously controllable mirrors to tip and tilt each mirror about first and second orthogonal axes and to translate each mirror in a third axis orthogonal to a plane containing the first and second orthogonal axes;
a laser source for generating laser energy at one or more wavelengths within the specified band to illuminate the MEMS MMA; and
one or more processors configured to generate command signals to partition the MMA into a plurality of segments, each segment comprising a plurality of mirrors responsive to tip, tilt and translate the mirrors to form the laser energy into a laser spot smaller than the FOV and to scan the laser spot over a sub-portion of the FOV within a frame time so that the laser illumination is inversely proportional to the response of the pixelated imager at the scan position to correct for the imager's non-uniform response over the scanned portion of the FOV, wherein the plurality of laser spots independently interrogate different local regions of the laser illuminated scene.

9. An active mode imaging sensor, comprising:
an imaging sub-system, comprising
a pixelated imager having a non-uniform response over a specified band of wavelengths,
optics having an entrance pupil configured to receive light from a laser illuminated scene over a field-of-view (FOV) and image the light onto the pixelated imager, and
a circuit for reading out a Non-Uniformed Corrected (NUC'd) image from the pixelated imager at a frame time,
an illumination sub-system, comprising
a Micro-Electro-Mechanical System (MEMS) Micromirror Array (MMA) comprising a plurality of independently and continuously controllable mirrors to tip and tilt each mirror about first and second orthogonal axes and to translate each mirror in a third axis orthogonal to a plane containing the first and second orthogonal axes, said mirrors comprising a reflective coating designed to reflect multiple wavelengths in the specified band;
a laser source that generates laser energy at the multiple wavelengths in the specified band to illuminate the MEMS MMA; and
one or more processors configured to generate command signals to tip, tilt and translate the mirrors to form the laser energy into a laser s of smaller than the FOV and to scan the laser spot over a portion of the FOV within a frame time so that the laser illumination is inversely proportional to the response of the pixelated imager at the multiple wavelengths at the scan position to correct for the imager's non-uniform response over the scanned portion of the FOV.

10. The active mode imaging sensor of claim 1, wherein the MEMS MMA is partitioned into sections each comprising a plurality of mirrors, wherein the mirrors in the different sections comprise reflective coatings designed to reflect at different wavelengths within the specified band, wherein within each section the MEMS MMA mirrors are responsive to command signals to tip, tilt and translate the mirrors to form the laser energy into a laser spot so that the laser illumination at the corresponding wavelength is inversely proportion to the response of the pixelated imager at the scan position.

11. The active mode imaging sensor of claim 10, wherein responsive to command signals at least one section of the MEMS MMA is partitioned into a plurality of segments each comprising a plurality of mirrors, wherein within each segment the MEMS MMA mirrors are responsive to command signals to tip, tilt and translate the mirrors to form the laser energy into a laser spot.

12. The active mode imaging sensor of claim 10, wherein the MEMS MMA mirrors are responsive to command signals to tip, tilt and translate the mirrors to provide coherence of a corrected wavefront of the multi-wavelength laser illumination at the scene.

13. The active mode imaging sensor of claim 1, wherein the MEMS MMA mirrors are responsive to command signals to control translation of the mirrors to correct a wavefront of the laser spot.

14. An active mode imaging sensor, comprising:
an imaging sub-system, comprising
a pixelated imager having a non-uniform response over a specified band of wavelengths,
optics having an entrance pupil configured to receive light from a laser illuminated scene over a field-of-view (FOV) and image the light onto the pixelated imager, and
a circuit for reading out a Non-Uniformed Corrected (NUC'd) image from the pixelated imager at a frame time,
an illumination sub-system, comprising
a Micro-Electro-Mechanical System (MEMS) Micromirror Array (MMA) comprising a plurality of independently and continuously controllable mirrors to tip and tilt each mirror about first and second orthogonal axes and to translate each mirror in a third axis orthogonal to a plane containing the first and second orthogonal axes;
a laser source for generating laser energy at one or more wavelengths within the specified band to illuminate the MEMS MMA; and
one or more processors configured to generate command signals to tip, tilt and translate the mirrors to simultaneously form the laser energy into a plurality of fixed laser spots each smaller than the FOV to instantly illuminate a portion of the FOV so that the laser illumination over the entire portion of the FOV is inversely proportional to the response of the pixelated imager to correct for the imager's non-uniform response over the illuminated portion of the FOV.

15. The active mode imaging sensor of claim 14, wherein the MEMS MMA comprises a plurality of mirrors per imager pixel.

16. The active mode imaging sensor of claim 14, wherein the MEMS MMA mirrors are responsive to command signals to tip, tilt and translate the mirrors to provide coherence of a corrected wavefront of the laser illumination at the scene.

17. The active mode imaging sensor of claim 14, wherein the MEMS MMA is partitioned into sections each comprising a plurality of mirrors, wherein the mirrors in the different sections comprise reflective coatings designed to reflect at different wavelengths within the specified band, wherein within each section the MEMS MMA mirrors are responsive to command signals to tip, tilt and translate the mirrors to simultaneously form the laser energy into a plurality of fixed laser spots so that the laser illumination at the corresponding wavelength is inversely proportion to the response of the pixelated imager.

18. The active mode imaging sensor of claim 14, wherein the laser source generates laser energy in a sequence of multiple pulses per frame, wherein between pulses the MEMS MMA responsive to the command signals tips, tilts and translates the mirrors.

19. An active mode imaging sensor, comprising:
  an imaging sub-system, comprising
    a pixelated imager having a non-uniform response over a specified hand of wavelengths,
    optics having an entrance pupil configured to receive light from a laser illuminated scene over a field-of-view (FOV) and image the light onto the pixelated imager, and
    a circuit for reading out a Non-Uniformed Corrected (NUC'd) image from the pixelated imager at a frame time,
  an illumination sub-system, comprising
    a Micro-Electro-Mechanical System (MEMS) Micromirror Array (MMA) comprising a plurality of independently and continuously controllable mirrors to tip and tilt each mirror about first and second orthogonal axes and to translate each mirror in a third axis orthogonal to a plane containing the first and second orthogonal axes, wherein the MEMS MMA is partitioned into sections each comprising a plurality of mirrors, wherein the mirrors in the different sections comprise reflective coatings designed to reflect at different wavelengths within the specified band;
    a laser source for generating laser energy at one or more wavelengths within the specified band to illuminate the MEMS MMA; and
  one or more processors configured to generate command signals to tip, tilt and translate the mirrors in each said section to form the laser energy into a laser spot smaller than the FOV and to scan the laser spot over a portion of the FOV within a frame time so that, the laser illumination at the corresponding wavelength is inversely proportional to the response of the pixelated imager at the scan position to correct for the imager's non-uniform response over the scanned portion of the FOV.

20. The active mode imaging sensor of claim 19, wherein the MEMS MMA mirrors are responsive to command signals to tip, tilt and translate the mirrors to provide coherence of a corrected wavefront of the laser illumination at the scene.

* * * * *

UNITED STATES PATENT AND TRADEMARK OFFICE
CERTIFICATE OF CORRECTION

PATENT NO. : 11,650,412 B2
APPLICATION NO. : 17/014350
DATED : May 16, 2023
INVENTOR(S) : Uyeno et al.

It is certified that error appears in the above-identified patent and that said Letters Patent is hereby corrected as shown below:

On the Title Page

Figure 3:
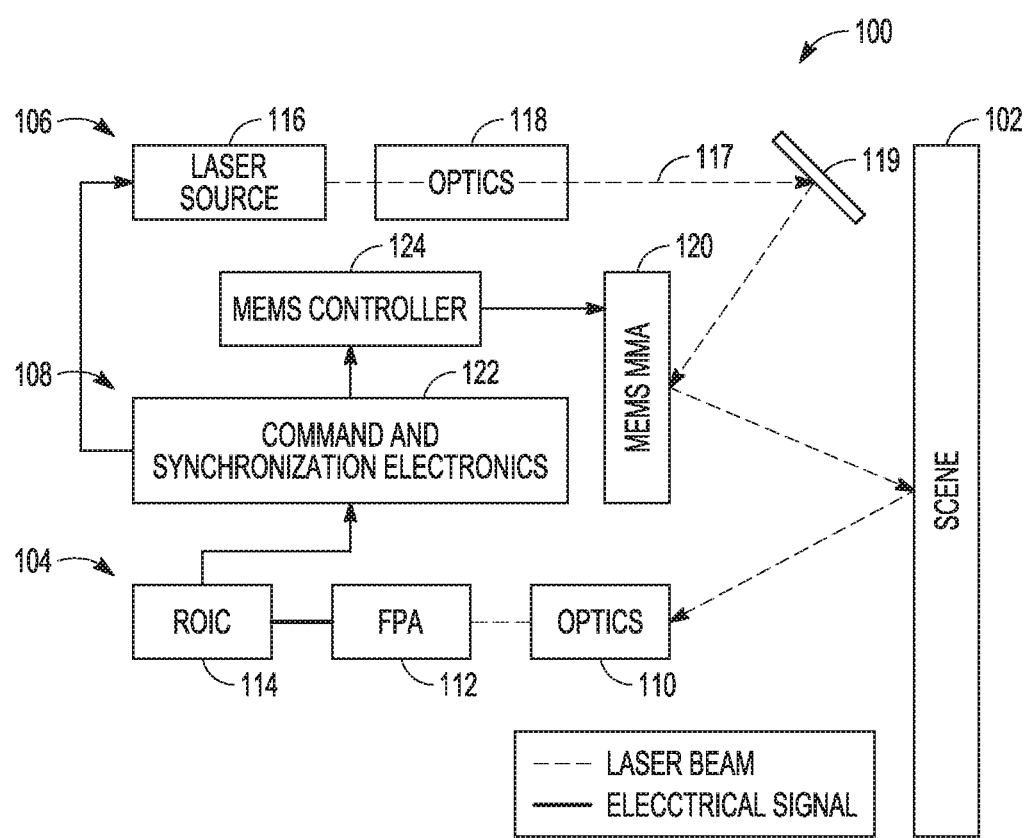
FIG. 3 is a block diagram of an embodiment of the active mode sensor including a tip/tilt/piston MEMS MMA for forming and scanning the spot.
Figure 4A:
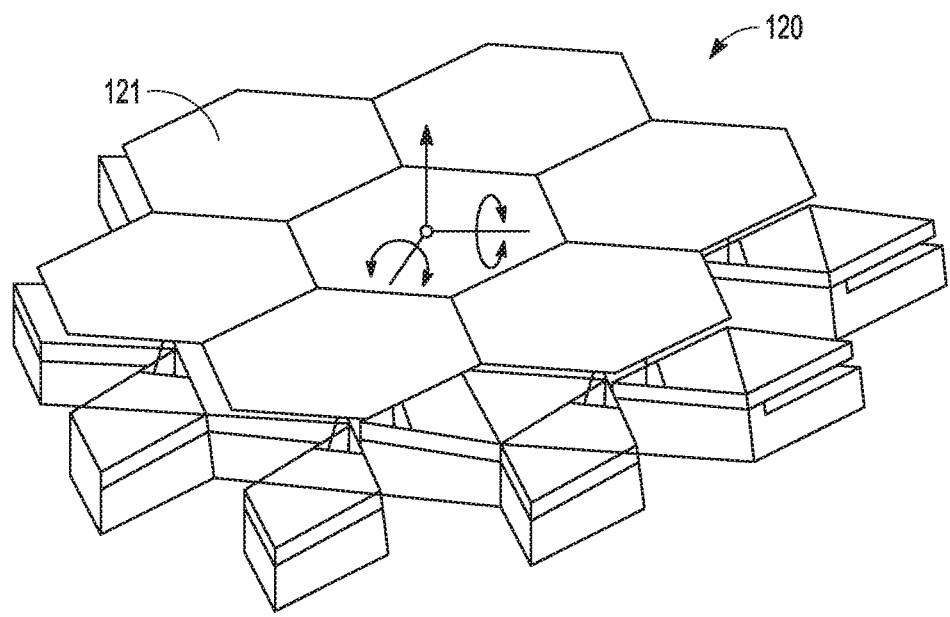
FIGS. 4A through 4C are diagrams of an embodiment of a tip/tilt/piston MEMS MMA, tip/tilt/piston actuation of a single mirror and tip/tilt/piston actuation of multiple mirrors to form (focus) and steer a laser spot.
Figure 4B:
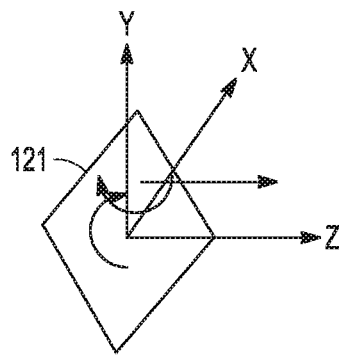
Figure 4C:
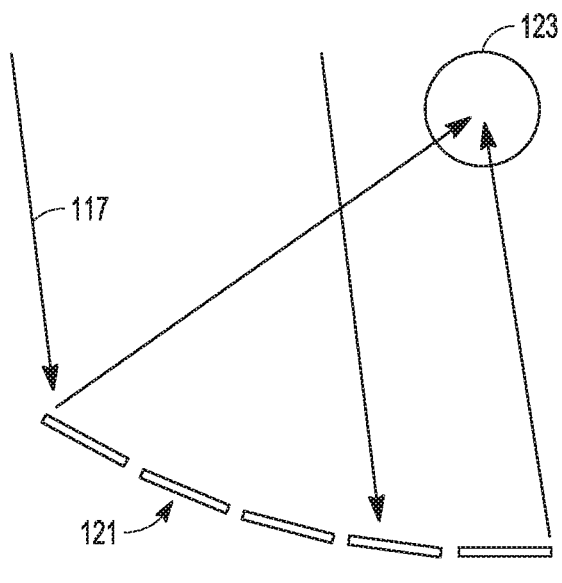

Item [54], in "Title", and in the Specification, Column 1, Line 5, delete "(MMAS)" and insert --(MMAs)-- therefor On page 2, in Column 2, under item [56] "Other Publications", Lines 19-20, delete "Mircro-Electromechanical" and insert --Micro-Electromechanical-- therefor On page 2, in Column 2, under item [56] "Other Publications", Line 20, delete "Mircromirror" and insert --Micromirror-- therefor In the Drawings Sheet 4 of 15, Fig. 3, delete "ELECCTRICAL" and insert --ELECTRICAL-- therefor In the Specification In Column 1, Line 5, delete "(MMAS)" and insert --(MMAs)-- therefor In Column 5, Line 62, delete "a" and insert --α-- therefor In Column 6, Line 1, before "power", delete "n"

In Column 6, Line 2, delete "a" and insert --α-- therefor

In Column 6, Line 54, delete "-10°×+100" and insert -- -10°×+10°-- therefor

In Column 7, Line 19, delete "LWR." and insert --LWIR.-- therefor

Signed and Sealed this
Thirteenth Day of August, 2024

Katherine Kelly Vidal
*Director of the United States Patent and Trademark Office*

CERTIFICATE OF CORRECTION (continued)
U.S. Pat. No. 11,650,412 B2

In the Claims

In Column 10, Line 13, in Claim 1, after "comprising", insert --:--

In Column 10, Line 21, in Claim 1, delete "frcxn" and insert --from-- therefor

In Column 10, Line 23, in Claim 1, after "comprising", insert --:--

In Column 10, Line 62, in Claim 5, delete "MFMS" and insert --MEMS-- therefor

In Column 11, Line 11 (Approx.), in Claim 8, after "comprising", insert --:--

In Column 11, Line 13 (Approx.), in Claim 8, delete "hand" and insert --band-- therefor In Column 11, Line 22 (Approx.), in Claim 8, after "comprising", insert --:--

In Column 11, Lines 24-25 (Approx.), in Claim 8, delete "independent)" and insert --independently-- therefor In Column 11, Line 48, in Claim 9, after "comprising", insert --:--

In Column 11, Line 58, in Claim 9, after "comprising", insert --:--

In Column 12, Line 6, in Claim 9, delete "s of" and insert --spot-- therefor

In Column 12, Line 41, in Claim 14, after "comprising", insert --:--

In Column 12, Line 51, in Claim 14, after "comprising", insert --:--

In Column 13, Line 30, in Claim 19, after "comprising", insert --:--

In Column 13, Line 32, in Claim 19, delete "hand" and insert --band-- therefor

In Column 14, Line 4, in Claim 19, after "comprising", insert --:--

In Column 14, Line 24, in Claim 19, delete "that," and insert --that-- therefor